(12) United States Patent
Yeh

(10) Patent No.: US 8,896,159 B2
(45) Date of Patent: Nov. 25, 2014

(54) LOW LEAKAGE IO CIRCUIT AND ASSOCIATED APPARATUS

(75) Inventor: Chun-Wen Yeh, Hsinchu County (TW)

(73) Assignee: MStar Semiconductor, Inc., Hsinchu County (TW)

( * ) Notice: Subject to any disclaimer, the term of this patent is extended or adjusted under 35 U.S.C. 154(b) by 732 days.

(21) Appl. No.: 13/189,104

(22) Filed: Jul. 22, 2011

(65) Prior Publication Data

US 2012/0146427 A1    Jun. 14, 2012

(30) Foreign Application Priority Data

Dec. 13, 2010   (TW) ................ 99143527 A

(51) Int. Cl.
*H02B 1/20* (2006.01)
*H03K 17/00* (2006.01)
*H03K 19/0185* (2006.01)
*H03K 19/00* (2006.01)

(52) U.S. Cl.
CPC .... *H03K 19/018592* (2013.01); *H03K 19/0005* (2013.01)
USPC ................ 307/112; 326/21; 326/27; 326/80; 326/81; 327/436

(58) Field of Classification Search
CPC ..................................... H03K 17/00
USPC ...................................... 307/112
See application file for complete search history.

(56) References Cited

U.S. PATENT DOCUMENTS

| | | | | |
|---|---|---|---|---|
| 5,610,425 | A | * | 3/1997 | Quigley et al. ............... 257/358 |
| 6,392,439 | B2 | * | 5/2002 | Tanaka et al. .................. 326/68 |
| 6,838,908 | B2 | | 1/2005 | Ker et al. |
| 7,242,559 | B2 | | 7/2007 | An et al. |
| 2009/0091870 | A1 | * | 4/2009 | Huang et al. .................... 361/56 |
| 2010/0202180 | A1 | | 8/2010 | Kim et al. |

OTHER PUBLICATIONS

Taiwan Patent Office, "Office Action", Nov. 19, 2013.
Taiwan Patent Office, "Office Action", Aug. 8, 2013.

* cited by examiner

*Primary Examiner* — Rexford Barnie
*Assistant Examiner* — Toan Vu
(74) *Attorney, Agent, or Firm* — WPAT, PC; Justin King

(57) ABSTRACT

A low-leakage IO circuit is provided. The IO circuit includes an impedance path between a pad and a power supply. The impedance path bypasses a signal path of the pad and includes a switch circuit. According to a relationship between voltages of the power supply and the pad of the IO circuit, the switch circuit selectively conducts the impedance path. When the power supply provides power normally, the switch circuit conducts the impedance path to provide a pull-up resistor between the pad and the power supply. When the power supply provides no power and its voltage is lower than a voltage of the pad, the switch circuit disconnects the conducting path to effectively reduce power leakage.

18 Claims, 2 Drawing Sheets

LOW LEAKAGE IO CIRCUIT AND ASSOCIATED APPARATUS

This application claims the benefit of Taiwan application Serial No. 99143527, filed Dec. 13, 2010, the subject matter of which is incorporated herein by reference.

BACKGROUND OF THE INVENTION

1. Field of the Invention

The invention relates in general to a low-leakage Input-Output (IO) circuit and associated apparatus, and more particularly to an IO circuit and associated apparatus applying an internal switch circuit to disconnect an impedance path of a pull-up resistor when a power supply is powered off, so as to effectively reduce power leakage.

2. Description of the Related Art

Electronic devices are one of the most crucial hardware foundations in modern information based society. An electronic device usually comprises integrated circuits and chips of different functions, and the integrated circuits and chips exchange signals with one another to yield a consolidated overall function of the electronic device.

In a chip, IO circuits and corresponding pads (e.g., signal IO pads) are means for chips to connect to external circuits (e.g., another chip or a printed circuit board) to form a signal exchange interface of the chip. To satisfy requirements of some signals, terminal resistors such as a pull-up resistor is provided in a pad or an IO circuit to maintain appropriate signal levels or to serve to match impedance of a corresponding signal path. When the chip is powered off, the pad of the chip continuously draws electric power from an external circuit connected to the chip via its impedance in the event that the external circuit keeps transmitting signals to the chip. For the external circuit, the pad of the chip simulates a leakage path through which electric power is continuously lost. Therefore, in certain signal exchange specifications, not only impedance of predetermined values (e.g., a pull-up resistor) are required for some pads of a signal exchange interface, but also leakage tolerance is regulated for the pads to limit leakage of the pads. For example, according to High-Definition Multimedia Interface (HDMI) specifications, strict standards are specified for Consumer Electronic Control (CEC) pins— it is therefore essential to have a satisfactory low-leakage pull-up resistor to achieve such leakage standards.

SUMMARY OF THE INVENTION

The invention is directed to an IO circuit and associated apparatus with a low-leakage pull-up resistor. The IO circuit and associated apparatus of the invention not only provides a pull-up resistor of appropriate resistance during normal operations of a chip, but also disrupts the pull-up resistor with an internal mechanism to effectively reduce power leakage and thereby satisfy leakage standards.

According to an aspect of the present invention, an IO circuit applied to a chip is provided. The IO circuit comprises a pad, a signal path, an impedance path, and a control circuit built in the chip. The signal path is coupled between the pad and an internal circuit and exchange signals via the pad. The impedance path bypasses the signal path, and is coupled between a power supply of the chip and the pad. The impedance path comprises a first node and a second node, and a switch circuit coupled between the first node and the second node. According to a relationship between voltages of the power supply and the pad (i.e., whether the power supply supplies power normally), the switch circuit selectively closes between the first and second nodes to control whether the impedance path conducts the power supply to the pad. Conversely, when the switch circuit opens between the first and second nodes, the impedance path disconnects the pad from the power supply to cut off a leakage path and reduce power leakage from the pad.

The switch circuit is controlled by the control circuit that is coupled between the power supply and the pad. According to a relationship between voltages of the power supply and the pad, the control circuit controls the switch circuit to selectively close between the first and second nodes. The control circuit comprises a control end coupled to a controlled end of the switch circuit. When the voltage of pad is higher than that of the power supply by a difference greater than a threshold voltage, it means that the power supply is disconnected, so that the control circuit opens the switch circuit to reduce/prevent power leakage. Conversely, when the voltage of the pad is less than that of the power supply, it means that the chip is powered normally, so that the control circuit closes the switch circuit to allow the impedance path to normally provide the pull-up resistor.

More specifically, according to an embodiment of the present invention, the impedance path further comprises a third node coupled between the pad and the switch circuit, and a fourth node coupled between the switch circuit and the power supply. The control circuit is coupled between the third and fourth nodes, and compares the voltages of the pad and the power supply according to the voltages of the third and fourth nodes. The control circuit further comprises a first control unit coupled between the third and fourth nodes and the control end, and a second control unit. When the voltage at the fourth node is lower than that at the third node by a difference greater than a threshold voltage, the first control unit couples the voltage at the third node to the control end of the control circuit to open the switch circuit. The first control unit comprises at least one p-channel metal oxide semiconductor (PMOS) transistor, which has its gate coupled to the fourth node and its drain-source coupled between the third node and the control end. For example, the threshold voltage is an absolute value of a threshold voltage of the transistor. To further prevent other possible leakage paths, a bulk of the PMOS transistor is kept floating.

The second control unit is coupled between the control end and a ground of the power supply. When the voltage of the power supply is greater than a threshold voltage, the second control unit couples the ground to the control end to close the switch circuit. For example, the second control unit comprises at least one n-channel metal oxide semiconductor (NMOS) transistor, which has its gate coupled to the power supply, its source coupled to a ground and its drain coupled to the control end of the control circuit.

For example, the switch circuit comprises at least one PMOS transistor, which has its gate coupled to the controlled end and its source-drain coupled between the two nodes. To further prevent other possible leakage paths, a bulk of the PMOS transistor is kept floating.

Apart from the control circuit and switch circuit, in order to realize the pull-up resistor, the impedance path of the present invention further comprises an internal resistor coupled between the third node and the switch circuit. For example, the impedance path further comprises between the pad and the third node an auxiliary resistor as an electrostatic discharge (ESD) protection resistor.

The IO circuit of the present invention may be generally applied to signal exchange interfaces that need to attend to both appropriate impedance and low leakage. For example, the IO circuit of the present invention is applied to an HDMI signal exchange interface to provide a low-leakage pull-up resistor at a CEC signal pad/pin.

According to another aspect of the present invention, a chip implementing the above mentioned IO circuit is provided.

The above and further aspects of the invention will become better understood with regard to the following detailed description of the preferred but non-limiting embodiment. The following description is made with reference to the accompanying drawings.

DETAILED DESCRIPTION OF THE INVENTION

Figure 1:
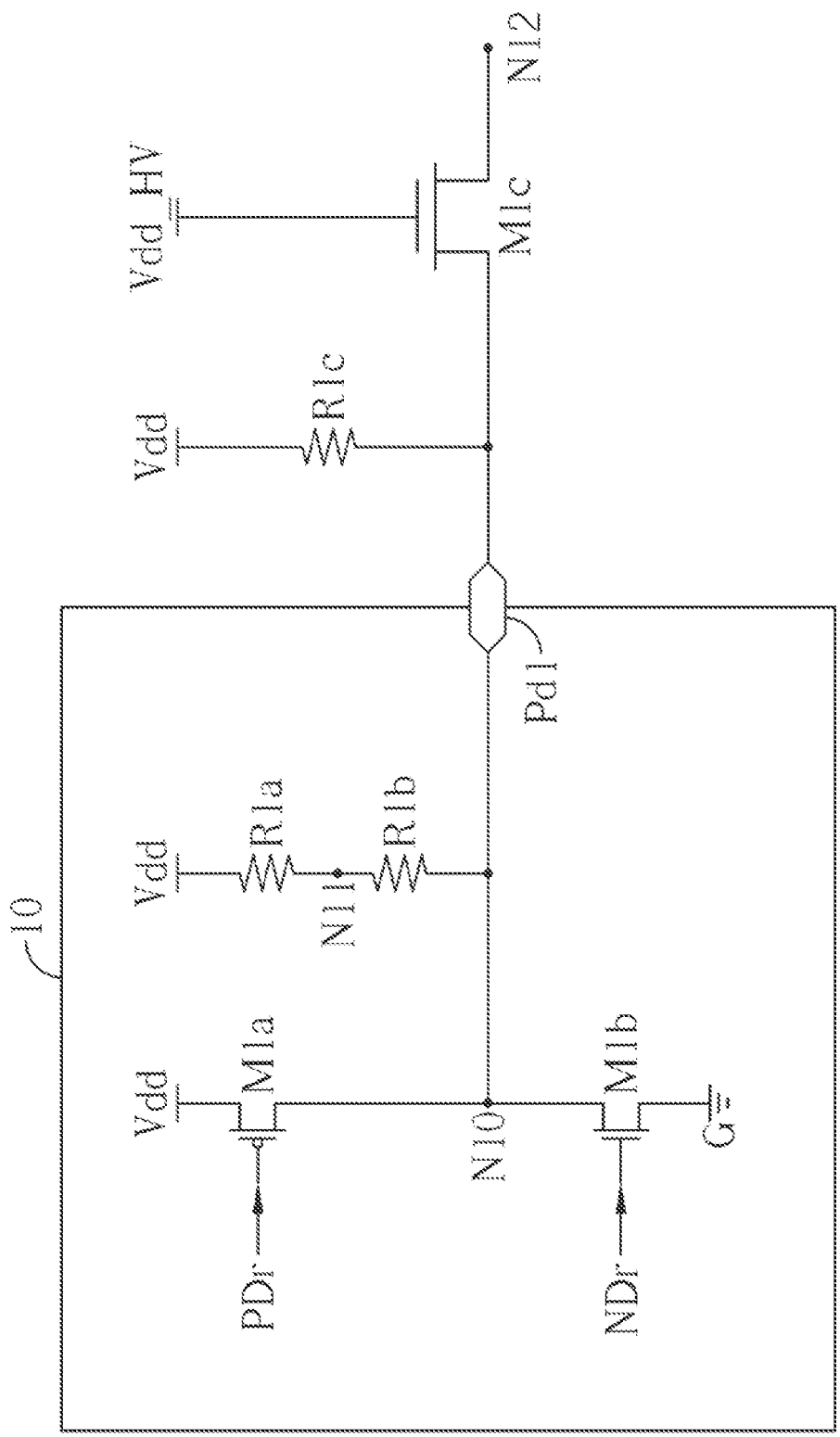
FIG. 1 is a block diagram illustrating an example of a chip provided with a pull-up resistor.

Referring to FIG. 1 showing a block diagram of an example of a chip 10 provided with a pull-up resistor, the chip 10 comprises transistor Ma1 and M1b respectively being a PMOS transistor and an NMOS transistor. Both the transistors have their drain and source serially connected between a power supply Vdd, a node N10 and a ground G, and their gate respectively receiving a driving control signal PDr and NDr to transmit or receive signals for the IO circuit, so that the chip 10 is allowed to exchange signals with an external circuit (not shown) via the pad Pd1. To realize pull-up resistance at the pad Pd1, the chip 10 comprises resistors Ra1 and Rb1 serially connected to the power supply Vdd, a node N11 and the pad Pd1. The resistor Ra1 is an internal resistor, and the resistor R1b is an ESD (electrostatic discharge) protection resistor. When the power supply Vdd supplies power to normally operate the chip 10, the resistors R1a and R1b assist in raising/maintaining a voltage of the power supply Vdd of the pad (i.e., the node N10) to a voltage of the power supply Vdd until the transistor M1b is conducted. Therefore, at this point, the resistors Ra1 and Rb1 serve as a pull-up resistor.

However, once the power supply Vdd stops supplying power and thus causes the chip 10 to stop operating, the resistors R1a and R1b may become a power leakage circuit path. In equivalence, when the power supply Vdd no longer supplies power, the pad Pd1 is coupled to a zero voltage (i.e., the power supply Vdd providing no power) via the resistors R1a and R1b. At this point, the resistors R1a and R1b nevertheless keep drawing power to result in power leakage when the external circuit connected to the pad Pd1 still provides a signal voltage.

FIG. 1 further illustrates a leakage control mechanism, which is realized by an external transistor M1c in conjunction with an external R1c external to the chip 10. The resistor R1c is coupled between the power supply Vdd and the pad Pd1; the transistor M1c is an NMOS transistor, which has its gate coupled to a power supply Vdd_HV, and its drain and source respectively coupled between the pad Pd1 and a node N12. It is essential that the power supply Vdd_HV be greater than the power supply Vdd by at least a threshold voltage, e.g., a threshold voltage of the transistor M1c. Under such a configuration, the external circuit connected to the pad Pd1 shall be conducted to the node N12; in other words, the external circuit formed by the transistor M1c and the resistor R1c in equivalence replaces the pad Pd1 via the node N12. When the power supplies Vdd_HV and Vdd supply power normally, the transistor M1c is conducted, the node N12 is conducted to the pad Pd1 to perform signal exchange, and the resistor R1c provides pull-up resistance. Conversely, when the power supply Vdd_HV stops supplying power, the transistor M1c stops being conducted between the node N12 and the pad Pd1, so that the resistor R1c is prohibited from drawing power from the node N12.

However, the leakage control mechanism described above suffers from various shortcomings. For example, the leakage control mechanism can only be realized by an externally connected transistor M1c. One of the reasons behind this is that the transistor M1c is connected at a signal path of signal exchange, which is a signal path from the node N12 to the pad Pd1. To prevent undesirable effects on a speed of signal exchange and electrical characteristics of the signal path, it is mandatory that the transistor M1c be provided with excellent conductance characteristics. For example, only minimal parasitic capacitance and resistance between the drain and source are tolerated, in a way that layout area and size of the transistor M1c cannot be reduced or compromised, meaning that it is unlikely that the transistor M1c can be integrated in the chip 10. Therefore, the transistor M1c is generally realized by an externally connected transistor, which inevitably consumes additional circuit allocation resources on a printed circuit board to increase design and manufacturing time and cost of an electronic device. Further, another power supply Vdd_HV higher than the power supply Vdd connected to the gate of the transistor M1c is required. Being greater than the power supply Vdd by at least a threshold voltage, the power supply Vdd_HV is also additionally slated to add extra cost for manufacture of the printed circuit board.

Figure 2:
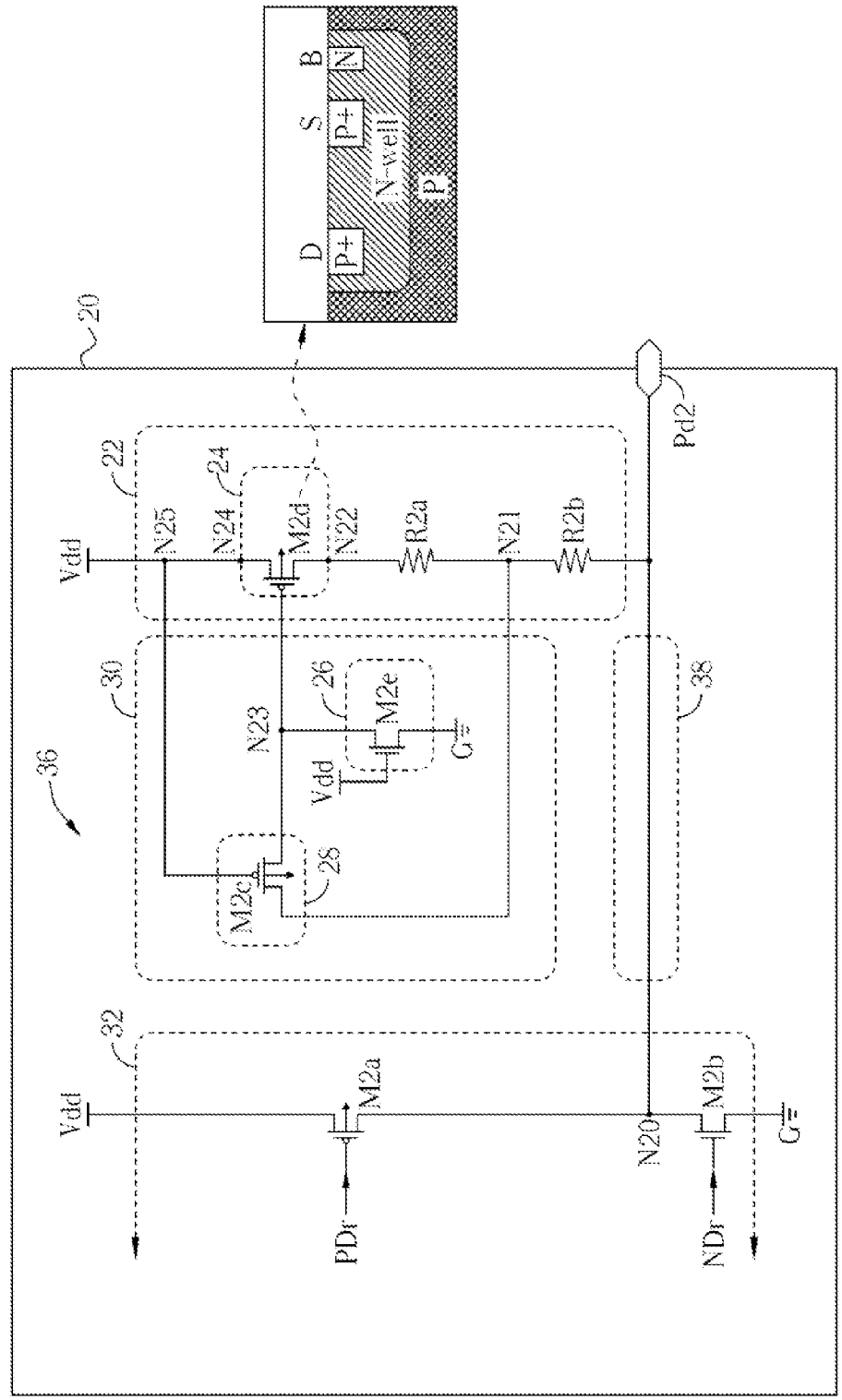
FIG. 2 is a schematic diagram of an IO circuit applied to a chip according to an embodiment of the present invention.

FIG. 2 shows a schematic diagram of a leakage control mechanism implemented to an IO circuit 36 in a chip 20 according to an embodiment of the present invention. The IO circuit 36 comprises a pad Pd2, a signal path 38, an impedance path 22 and a control circuit 30 built-in the chip 20, and an internal circuit 32. A power supply Vdd provides operating voltage and power to the IO circuit 36 and the chip 20. The internal circuit 32 comprises transistors M2a and M2b, which are respectively a PMOS transistor and an NMOS transistor, for example. The transistors M2a and M2b have their source-drain serially connected to the power supply Vdd, a node N20 and a ground G, and their gate respectively controlled by driving controls PDr and NDr to perform signal exchange at the node N20 (i.e., the pad Pd2), including signal transmission, receiving, and transceiving. Therefore, a connection between the node N20 and the pad Pd2 may be regarded as a signal path 38 implemented through a variety of means.

In this embodiment, the impedance path 22 comprises a switch circuit 24 and two resistors R2a and R2b. The impedance path 22 bypasses the signal path 38. In other words, the impedance path 22 and the signal path 38 are two circuit branches bifurcated from the pad Pd2. The impedance path 22 is coupled between the power supply Vdd and the pad Pd2, and further comprises a plurality of nodes N21 (may be regarded as a third node), N22 (may be regarded as a first node), N24 (may be regarded as a second node), and N25 (may be regarded as a fourth node). The switch circuit 24 is coupled between the nodes N22 and N24. For example, a resistor R2b coupled between the node N21 and the pad Pd2 is an ESD protection resistor for protecting the pad Pd2 against possible ESD. Another resistor R2a, being an internal resistor, is coupled between the nodes N22 and N21. The switch circuit 24 comprises at least one PMOS transistor; in FIG. 2, a transistor M2d is taken as an example for illustration purposes. The transistor M2d has its gate regarded as a controlled end of the switch circuit 24, and its source-drain coupled between the two nodes N24 and N22.

The control circuit 30 is coupled to the power supply Vdd and the pad Pd2 via impedance path 22. According to the embodiment shown in FIG. 2, the control circuit 30 is respectively coupled to the pad Pd2 and the power supply Vdd via the node N21 and the node N25 to sense/compare voltages at the nodes N21 and N25 with those of the pad Pd2 and the power supply Vdd. The node N23 is regarded as a control end coupled to the controlled end of the switch circuit 24. As shown in FIG. 2, in this embodiment, the control circuit 30 comprises two control units 26 and 28. The control unit 28 (i.e., the first control unit) is coupled between the nodes N21 and N25 and the control end (node N23). For example, the control unit 28 comprises at least one PMOS transistor; a transistor M2c is taken as an example. The transistor M2c has its gate coupled to the node N25, and its drain-source coupled between the node N21 and the control end (node N23). The control unit 26, coupled between the control end, the power supply Vdd, and the ground G, comprises at least one NMOS transistor; a transistor M2e is taken as an example. The transistor M2e has its gate coupled to the power supply Vdd, its source coupled to the ground G, and its drain coupled to the control end (node N23) of the control circuit 30.

In FIG. 2, according to a relationship between the voltages of the power supply Vdd and the pad Pd2, whether the power supply Vdd operates normally to provide operating voltage and power can be deduced, according to which the control circuit 30 selectively closes between the nodes N22 and N24 to control impedance path 22 whether to couple the power supply Vdd to the pad Pd2.

When the power supply Vdd provides a normal operating voltage, its voltage is greater than a threshold voltage (e.g., a threshold voltage of the transistor M2d) to conduct the control unit 26 that further couples the ground G to the control end (node N23), so as to close the switch circuit 24. When the switch 24 closes between the nodes N22 and N24, the impedance path 22 is conducted between the power supply Vdd and the pad Pd2. In addition, conducting resistance of the resistors R2a and R2b as well as the switch circuit 24 between the nodes N22 and N24 serves as a pull-up resistor between the power supply Vdd and the pad Pd2. The voltage at the node N25 is not less than the voltage at the node N21, and the control unit 28 (the transistor M2c) is not conducted.

In contrast, when the power supply Vdd stops supplying a normal operating voltage, the voltage of the power supply Vdd reduces to approximate the zero voltage of the ground. At this point, supposing the voltage of the pad Pd2 is greater than that of the power supply Vdd by a difference greater than a threshold voltage (e.g., an absolute value of the transistor M2c), it means that signals are still present at the external circuit (not shown in FIG. 2) connected to the pad Pd2. In this embodiment, the leakage control mechanism is activated, such that the control unit (the transistor Mc2) is conducted to couple the voltage at the node N21 to the control end (the node N23) of the control circuit 30 to further open the switch circuit 24 (the transistor M2d). When the switch circuit 24 is open between the node N22 and N24, the impedance path 22 stops conducting the pad Pd2 to the power supply Vdd to cut off the leakage path, thereby reducing/preventing power leakage from the pad Pd2. Meanwhile, the control unit 26 (the transistor M2e) is not conducted due to a low voltage level at the power supply Vdd.

In this embodiment, the switch circuit 24 bypasses the signal path 38, leaving the signal exchange on the signal path 38 unaffected. Therefore, the switch circuit 24 (the transistor M2d) need not be realized by a large-area nor large-sized transistor. Compared to the transistor M1c in FIG. 1, the switch circuit 24 according to the embodiment of the invention significantly reduces its layout area to 1/100 of that of the transistor M1c. Preferably, without consuming circuit allocation resources outside the chip 20, the leakage mechanism according to the embodiment of the present invention is entirely built in the chip 20, so as to again reduce time and cost of design, manufacturing, and processing of an electronic device.

In this embodiment, the switch circuit 24 and the control unit 28 to the bulks of the PMOS transistors M2d, M2c, and M2a are kept floating. For example, the bulk of the transistor M2d is FIG. 2 is illustrated as being kept floating. The PMOS transistor is formed on an N-well, which is developed at a doped region P (e.g., a p-type base or a heavy P-well), with two p-type heavy doped regions P+ of the N-well respectively forming the drain D and the source S of the PMOS transistor; whereas another N-type doped region N forms a bulk B for receiving a voltage and bypassing the N-well. By keeping the bulk B floating, the bulk B is maintained unattached to any semiconductor structures having a constant bias voltage, e.g., the power supply Vdd, a source of a transistor or a guarding ring. Preferably, the transistor M2d is kept floating as the bulk to prevent a leakage path of the bulk.

Therefore, compared to the solutions associated with the prior art, the leakage control mechanism built in a chip not only provides an appropriate pull-up resistor during normal operations of the power supply and the chip, but also disconnects a leakage path when the power supply for the chip is disrupted. The IO circuit 36 according to the above embodiment of the invention may be generally applied to signal exchange interfaces that need to attend to both appropriate impedance and low leakage. For example, the IO circuit of the present invention is applied to an HDMI signal exchange interface to provide a low-leakage pull-up resistor at a CEC signal pad/pin. Although, in the embodiment in FIG. 2, the switch circuit 24 and the control units 26 and 28 are respectively realized by the transistors M2d, M2c, and M2e, they can also be realized by several transistors connected in series or parallel. Further, the resistors R2a and R2b may be realized by various passive or active elements (e.g., transistors) having appropriate impedance. According to actual requirements, resistors or impedance may also be provided between the nodes N24 and N25, and/or the node N25 and the power supply Vdd. Apart from the transistors M2a and M2b, the internal circuit 32 may further comprise other types of circuits from a receiving circuit, a level shifter, and/or other ESD protection circuits.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A low leakage input/output (TO) circuit, comprising:
   a power supply;
   a pad;
   an impedance circuit, coupled between the power supply and the pad, the impedance circuit comprising a first node, a second node, and a switch circuit coupled between the first node and the second node; and
   a control circuit, coupled between the power supply and the pad, for controlling the switch circuit to conduct the first node and the second node according to a relationship between a power supply voltage and a pad voltage;
   wherein the switch circuit comprises a controlled end, and the control circuit comprises a control end coupled to the controlled end, and the control circuit controls the switch circuit to stop conducting when the pad voltage is greater than the power supply voltage, and controls the switch circuit to conduct when the pad voltage is not greater than the power supply voltage; and wherein, the switch circuit selectively conducts the first node to the second node, so as to control the impedance circuit to selectively conduct voltage from the power supply to the pad.

2. The low leakage IO circuit according to claim 1, wherein when the switch circuit conducts the first node and the second node, the impedance circuit is conducted to provide a pull-up resistor between the power supply and the pad.

3. The low leakage IO circuit according to claim 1, wherein when the switch circuit opens between the first node and the second node, the impedance circuit disconnects the pad from the power supply.

4. The low leakage IO circuit according to claim 1, wherein the impedance circuit further comprises a third node and a fourth node, with the third node disposed between the pad and the switch circuit, and the fourth node disposed between the switch circuit and the power supply, and the control circuit is coupled between the third node and the fourth node so as to compare the pad voltage with the power supply voltage according to voltages of the third node and the fourth node.

5. The low leakage IO circuit according to claim 4, wherein the control circuit comprises:

a first control unit, coupled between the third node, the fourth node, and the control end, for coupling the voltage at the third node to the control end to stop conducting the switch circuit when the voltage at the fourth node is less than the voltage at the third node.

6. The low leakage IO circuit according to claim 5, wherein the first control unit comprises a PMOS transistor, which has a gate coupled to the fourth node, a drain, and a gate coupled to both the third node and the control end.

7. The low leakage IO circuit according to claim 6, wherein the PMOS transistor is kept floating.

8. The low leakage IO circuit according to claim 4, wherein the control circuit comprises:

a second control unit, coupled between the control end, the power supply and a ground, for coupling the ground to the control end to conduct the switch circuit when the power supply voltage of is greater than a threshold voltage.

9. The low leakage IO circuit according to claim 8, wherein the second control unit comprises an NMOS transistor, which has a gate coupled to the power supply, a source coupled to the ground, and a drain coupled to the control end.

10. The low leakage IO circuit according to claim 4, wherein the impedance circuit further comprises an internal resistor coupled between the third node and the switch circuit.

11. The low leakage IO circuit according to claim 4, wherein the impedance path further comprises an electrostatic discharge (ESD) protection resistor coupled between the pad and the third node.

12. The low leakage IO circuit according to claim 1, wherein the switch circuit comprises a PMOS transistor, which has a gate coupled to the controlled end, and a source and a drain coupled between the first node and the second node.

13. The low leakage IO circuit according to claim 12, wherein a bulk of the PMOS transistor is kept floating.

14. The low leakage IO circuit according to claim 1, wherein the pad is for transmitting a Consumer Electronic Control (CEC) signal.

15. The low leakage IO circuit according to claim 1, further comprising:

a signal path, coupled to the pad, for transmitting signals via the pad, bypassing the impedance path.

16. A chip, comprising:

a pad;

an impedance circuit, coupled between a power supply and the pad, the impedance circuit comprising a first node, a second node, and a switch circuit coupled between the first node and the second node; and a control circuit, coupled between the power supply and the pad, for controlling the switch circuit to conduct the first node and the second node;

wherein the switch circuit comprises a controlled end, and the control circuit comprises a control end coupled to the controlled end, and the control circuit controls the switch circuit to stop conducting when the pad voltage is greater than the power supply voltage, and controls the switch circuit to conduct when the pad voltage is not greater than the power supply voltage; and wherein, the switch circuit selectively conducts the first node to the second node, so as to control the impedance circuit to selectively conduct the power supply to the pad.

17. The chip according to claim 16, further comprising:

an internal circuit, coupled to the pad via a signal path to transmit signals via the pad;

wherein, the signal path bypasses the impedance circuit.

18. The chip according to claim 16, wherein when the switch circuit closes between the first node and the second node, the impedance circuit is conducted to provide a pull-up resistor between the power supply and the pad.

* * * * *